(12) United States Patent
Qiu

(10) Patent No.: US 10,603,729 B2
(45) Date of Patent: Mar. 31, 2020

(54) STAGGERED-TEETH DIAMOND SAW BLADE AND PREPARATION METHOD THEREOF

(71) Applicant: Jiangsu Fengtai Tools Co. Ltd., Danyang, Jiangsu (CN)

(72) Inventor: Yuming Qiu, Jiangsu (CN)

(73) Assignee: Jiangsu Fengtai Tools Co. Ltd., Jiangsu (CN)

( * ) Notice: Subject to any disclaimer, the term of this patent is extended or adjusted under 35 U.S.C. 154(b) by 132 days.

(21) Appl. No.: 15/839,848

(22) Filed: Dec. 13, 2017

(65) Prior Publication Data

US 2018/0099340 A1 Apr. 12, 2018

(30) Foreign Application Priority Data

Jul. 17, 2017 (CN) .......................... 2017 1 0583382

(51) Int. Cl.

| | |
|---|---|
| *B24D 5/04* | (2006.01) |
| *B23D 61/02* | (2006.01) |
| *B28D 1/12* | (2006.01) |
| *B23D 65/00* | (2006.01) |
| *B23K 1/002* | (2006.01) |
| *B23K 1/005* | (2006.01) |
| *C23C 14/16* | (2006.01) |

(52) U.S. Cl.
CPC ......... *B23D 61/021* (2013.01); *B23D 61/026* (2013.01); *B23D 61/028* (2013.01); *B23D 65/00* (2013.01); *B23K 1/002* (2013.01); *B23K 1/0056* (2013.01); *B28D 1/121* (2013.01); *C23C 14/16* (2013.01)

(58) Field of Classification Search
CPC . B28D 1/121; B24D 5/06; B24D 5/10; B23D 61/02; B23D 61/026; B23D 61/028
USPC .................. 125/15, 13.01; 451/541, 542, 449
See application file for complete search history.

(56) References Cited

U.S. PATENT DOCUMENTS 5,697,359 A * 12/1997 Okanishi .............. B23D 61/026
125/15

FOREIGN PATENT DOCUMENTS

KR 2003-025425 * 3/2003

* cited by examiner

*Primary Examiner* — Robert A Rose

(57) ABSTRACT

A staggered-teeth diamond saw blade includes a circular steel base and a side wall provided at an outer edge of the steel base. Multiple first diamond cutter heads and multiple second diamond cutter heads are alternately arranged at the side wall through laser brazing; multiple diamond teeth protection cutter heads are uniformly distributed on an external surface of the steel base through high frequency induction brazing; a pre-plating layer is preformed at a welding surface where the side wall is welded with the first diamond cutter heads and the second diamond cutter heads; a pre-plating layer is preformed at a welding surface where the external surface of the steel base is welded with the diamond teeth protection cutter heads. The diamond cutter heads of the present invention are staggered to thicken the thickness thereof while cutting concrete pavement and other materials at high speed.

2 Claims, 2 Drawing Sheets

STAGGERED-TEETH DIAMOND SAW BLADE AND PREPARATION METHOD THEREOF

CROSS REFERENCE OF RELATED APPLICATION

The present invention claims priority under 35 U.S.C. 119(a-d) to CN 201710583382.9, filed Jul. 17, 2017.

BACKGROUND OF THE PRESENT INVENTION

Field of Invention

The present invention relates to a technical field of diamond tools, and more particularly to a staggered-teeth diamond saw blade and a preparation method thereof.

Description of Related Arts

Concrete pavement maintenance and repair, as well as the cutting and maintenance of engineering bridges usually adopt the diamond saw blade. In the prior art, the diamond saw blade is typically connected through brazing a steel base and a diamond cutter head. Commonly used brazing methods of the diamond saw blade comprise flame brazing, salt bath brazing, resistance brazing, high frequency brazing (induction brazing), and vacuum brazing. The flame brazing has low input and the salt bath brazing has micro deformation, which are the main brazing methods once and replaced by the high frequency induction brazing due to flexibility and convenience, high efficiency, energy saving and small investment now. The laser brazing has advantages of high brazing strength and high bonding strength, and thus has been rapidly developed in recent years. Today, the high-frequency induction brazing and the laser brazing have become the mainstream methods. However, the high-frequency induction brazing or the laser brazing process usually needs to apply solder or silver solder sheets, and because the laser brazing or the induction brazing is high in power, for the staggered-teeth diamond saw blade, stomas or voids easily occur at the welding seam, which causes that the brazing strength is unable to meet the requirements.

SUMMARY OF THE PRESENT INVENTION

To solve technical problems mentioned above in the prior art, an object of the present invention is to provide a staggered-teeth diamond saw blade and a preparation method thereof.

Accordingly, in order to accomplish the above object, the present invention adopts technical solutions as follows.

A staggered-teeth diamond saw blade comprises: a circular steel base and a side wall provided at an outer edge of the steel base, wherein:

multiple first diamond cutter heads and multiple second diamond cutter heads are alternately arranged at the side wall through laser brazing; the first diamond cutter heads are staggered towards an outer side of the side wall at a certain distance along an inner side of the side wall; the second diamond cutter heads are staggered towards the inner side of the side wall at a certain distance along the outer side of the side wall; multiple diamond teeth protection cutter heads are uniformly distributed on an external surface of the steel base through high frequency induction brazing; a pre-plating layer is preformed at a welding surface where the side wall is welded with the first diamond cutter heads and the second diamond cutter heads; a pre-plating layer is preformed at a welding surface where the external surface of the steel base is welded with the diamond teeth protection cutter heads.

Preferably, a width of the first diamond cutter heads and the second diamond cutter heads is equal to a width of the side wall, and a staggered distance is ¼-½ of the width of the side wall, such as the staggered distance is ¼, ⅓ and ½ of the width of the side wall.

Preferably, a thickness of the pre-plating layer is in a range of 0.1 mm-0.5 mm.

Preferably, the pre-plating layer comprises a copper or copper alloy sub-layer.

Preferably, the pre-plating layer further comprises a nickel base sub-layer with a thickness of 0.05 mm-0.2 mm.

Preferably, the pre-plating layer is formed through vacuum coating which comprises hot evaporation coating, magnetron sputtering and arc ion plating, and more preferably, is formed through arc ion plating.

Also, the present invention provides a method for preparing a staggered-teeth diamond saw blade, comprising:

(1) preparing a circular steel base, multiple first diamond cutter heads, multiple second diamond cutter heads and multiple diamond teeth protection cutter heads, and pretreating a welding surface of the circular steel base through purification;

(2) forming a pre-plating layer on the welding surface of the circular steel base through vacuum coating; and (3) processing the multiple first diamond cutter heads and multiple second diamond cutter heads on a side wall where the pre-plating layer is formed through laser brazing, and processing the multiple diamond teeth protection cutter heads on an external surface of the circular steel base where the pre-plating layer is formed through high frequency induction brazing, wherein: the first diamond cutter heads are staggered towards an outer side of the side wall at a certain distance along an inner side of the side wall; the second diamond cutter heads are staggered towards the inner side of the side wall at a certain distance along the outer side of the side wall.

Preferably, the pre-plating layer comprises a copper or copper alloy sub-layer. More preferably, the pre-plating layer further comprises a nickel base sub-layer with a thickness of 0.05 mm-0.2 mm.

Preferably, the pre-plating layer is formed through vacuum coating which comprises hot evaporation coating, magnetron sputtering and arc ion plating. More preferably, the pre-plating layer is formed through arc ion plating.

Compared with the prior art, the staggered-teeth diamond saw blade and the preparation method thereof provided by the present invention have beneficial effects as follows.

(1) In the present invention, the diamond cutter heads are staggered to thicken the thickness thereof while cutting concrete pavement and other materials at high speed through the cutting machine, so as to meet the application of the construction sites such as new concrete pavement expansion joints and wall troughs, and ground heating troughs. Compared with the common diamond blades, the saw blade provided by the present invention is sharper while cutting, which not only improves the cutting efficiency, but reduces the power consumption.

(2) Before laser welding and high frequency welding, a pre-plating layer is preformed on the welding surface to improve the quality of the brazing seam and the shear resistant strength, so that the staggered diamond cutter heads are able to meet the performance requirements of high speed impact cutting.

DETAILED DESCRIPTION OF THE PREFERRED EMBODIMENT

A staggered-teeth diamond saw blade and a preparation method thereof provided by the present invention will be further described accompanying with specific embodiments as follows, so as to help those skilled in the art have a more complete, accurate and in-depth understanding of the inventive concept and technical solutions of the present invention. It should be noted that the description of the structure, function, and material in the embodiments is exemplary and is not intended to limit the protective scope of the present invention.

Figure 1:
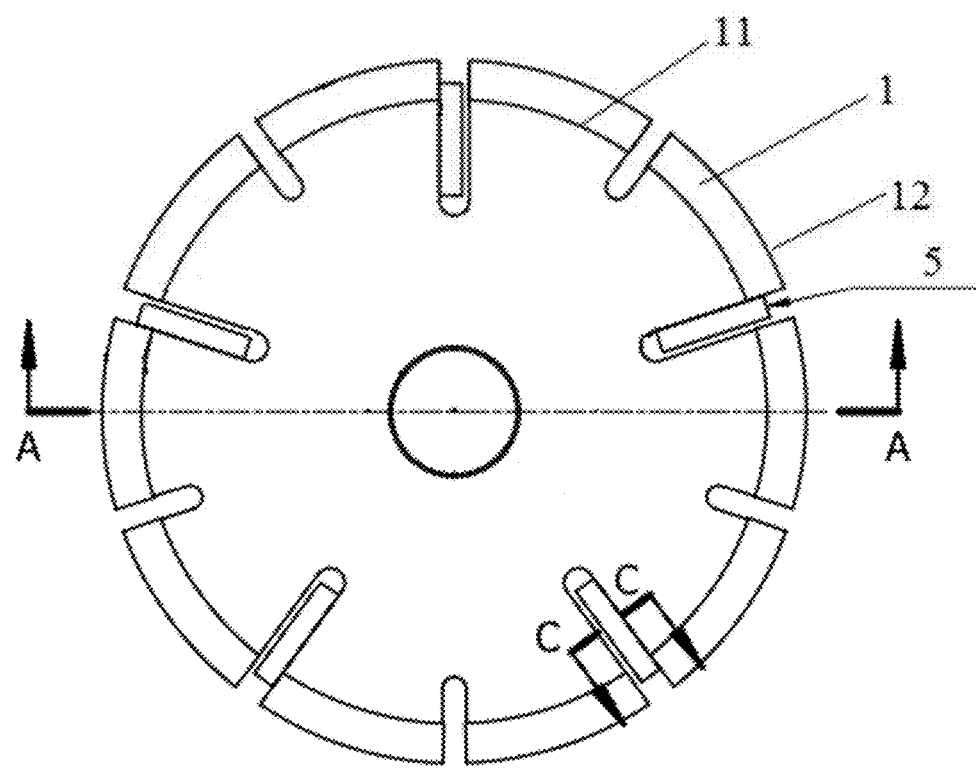
FIG. 1 is a structurally schematic view of a staggered-teeth diamond saw blade of the present invention.
Figure 2:
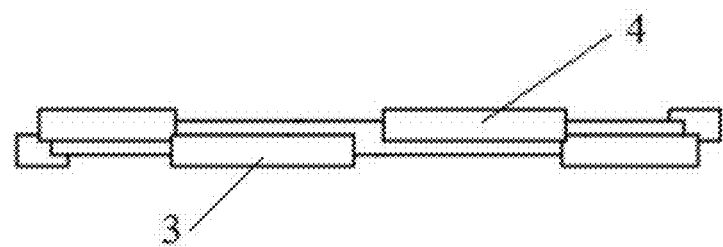
FIG. 2 shows alternately arranged first diamond cutter heads and second diamond cutter heads.
Figure 3:
FIG. 3 is a sectional view of A-A in FIG. 1.
Figure 4:
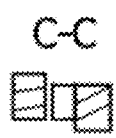
FIG. 4 is a sectional view of C-C in FIG. 1.

Referring to FIG. 1, a staggered-teeth diamond saw blade provided by the present invention comprises a circular steel base 1 which has two round main surfaces, namely, an inner main surface 11 and an outer main surface 12, and a side wall 2 provided at an outer edge of the steel base 1. Multiple first diamond cutter heads 3 and multiple second diamond cutter heads 4 are alternately arranged at the side wall through laser brazing. The first diamond cutter heads 3 are staggered towards the outer main surface 12 at a certain distance along an inner side of the side wall 2. The second diamond cutter heads 4 are staggered towards the inner main surface 11 at a certain distance along an outer side of the side wall 2. Multiple diamond teeth protection cutter heads 5 are uniformly distributed on the outer main surface 12 of the steel base 1 through high frequency induction brazing. A width of the first diamond cutter heads 3 and the second diamond cutter heads 4 is substantially equal to or slightly different from a width of the side wall 2, and a staggered distance is ¼-½ of the width of the side wall 2. For example, the staggered distance is ¼, ⅓ and ½ of the width of the side wall. For the steel base with a thickness of 6 mm, a thickness of the first diamond cutter heads 3 or the second diamond cutter heads 4 is preferably 6 mm, and of course, is able to be 5 mm or 7 mm according to actual conditions, and the staggered distance is 2 mm. The same as the prior art is that a junk slot is provided between adjacent diamond cutter heads, such as between a first diamond cutter head and an adjacent second diamond cutter head; and moreover, an assembly hole is formed in a center of the steel base through machining to assemble with a cutting machine. When the diamond teeth protection cutter heads are arranged on a main surface of the steel base (referring to the drawing), the main surface is the outer main surface, a thickness of the diamond teeth protection cutter heads is generally designed to a thickness of the staggered distance. For example, as above, the thickness of the diamond teeth protection cutter heads is 2 mm or thicker. The diamond cutter heads are not particularly limited in the present invention, which are able to be prepared by iron-based metal binders, copper-base metal binders and diamond particles through preparing materials, mixing, cold pressing and hot pressing sintering process.

For the staggered-teeth diamond saw blade, compared with normally arranged diamond cutter heads (whose welding surfaces coincide with the side wall), the first diamond cutter heads and the second diamond cutter heads need to withstand higher shear stress while cutting high-speed concrete pavement and other building materials at high speed. Therefore, in order to improve a qualified rate of laser brazing and high-frequency induction brazing, a pre-plating layer is preformed at the welding surface of the side wall with the first diamond cutter heads and the second diamond cutter heads in the present invention; a pre-plating layer with a thickness of 0.1 mm-0.5 mm is preformed at the welding surface of the external surface of the steel base and the diamond teeth protection cutter heads. The pre-plating layer comprises a copper or copper alloy sub-layer; and is formed through vacuum coating, such as evaporation coating, magnetron sputtering coating and arc ion plating, and preferably, through arc ion plating. Preferably, the pre-plating layer further comprises a nickel base sub-layer with a thickness of 0.05 mm-0.2 mm; and especially, the pre-plating layer formed though arc ion plating, which comprises the nickel base sub-layer and the copper or copper alloy sub-layer, is able to form a continuous transition layer, so as to simultaneously ensure the wettability between the pre-plating layer and the steel base with the diamond cutter heads, and reduce stomas, thus further improving welding strength and shear-resistant performance compared with the conventional silver welding plates.

Embodiment 1

A copper silver alloy layer (Ag10Cu90 with a molar ratio of 10:90) with a thickness of 0.2 mm is formed on a surface to be welded of a steel base and diamond head cutter heads (which comprises diamond teeth protection cutter heads) through magnetron sputtering. First diamond cutter heads and second diamond cutter heads are brazed to a welding surface of a side wall through laser brazing, wherein a laser power is 1000 W, a scanning speed is 60 mm/min, and a brazing temperature is 950° C. The diamond teeth protection cutter heads are brazed to a welding surface of an external surface of the steel base through vacuum induction brazing, wherein a brazing temperature is 780° C., a pre-pressure is 100 MPa, and a time is 20 s.

Embodiment 2

A copper silver alloy layer (Ag10Cu90 with a molar ratio of 10:90) with a thickness of 0.2 mm is formed on a surface to be welded of a steel base and diamond head cutter heads (which comprises diamond teeth protection cutter heads) through arc ion plating. First diamond cutter heads and second diamond cutter heads are brazed to a welding surface of a side wall through laser brazing, wherein a laser power is 1000 W, a scanning speed is 60 mm/min, and a brazing temperature is 950° C. The diamond teeth protection cutter heads are brazed to a welding surface of an external surface of the steel base through vacuum induction brazing, wherein a brazing temperature is 780° C., a pre-pressure is 100 MPa, and a time is 20 s.

Embodiment 3

A nickel layer with a thickness of 0.05 mm is firstly formed and then a copper silver alloy layer (Ag10Cu90 with a molar ratio of 10:90) with a thickness of 0.15 mm is formed on a surface to be welded of a steel base and diamond head cutter heads (which comprises diamond teeth protection cutter heads) through magnetron sputtering. First diamond cutter heads and second diamond cutter heads are brazed to a welding surface of a side wall through laser brazing, wherein a laser power is 1000 W, a scanning speed is 60 mm/min, and a brazing temperature is 950° C. The diamond teeth protection cutter heads are brazed to a welding surface of an external surface of the steel base through vacuum induction brazing, wherein a brazing temperature is 780° C., a pre-pressure is 100 MPa, and a time is 20 s.

Embodiment 4

A nickel layer with a thickness of 0.05 mm is firstly formed and then a copper silver alloy layer (Ag10Cu90 with a molar ratio of 10:90) with a thickness of 0.15 mm is formed on a surface to be welded of a steel base and diamond head cutter heads (which comprises diamond teeth protection cutter heads) through arc ion plating. First diamond cutter heads and second diamond cutter heads are brazed to a welding surface of a side wall through laser brazing, wherein a laser power is 1000 W, a scanning speed is 60 mm/min, and a brazing temperature is 950° C. The diamond teeth protection cutter heads are brazed to a welding surface of an external surface of the steel base through vacuum induction brazing, wherein a brazing temperature is 780° C., a pre-pressure is 100 MPa, and a time is 20 s.

Comparative Example 1

A silver tablet (whose composition AgCuZnCd is as same as a silver solder with a grade of Z35) with a thickness of 0.2 mm is formed on a surface to be welded of a steel base and diamond head cutter heads (which comprises diamond teeth protection cutter heads) through magnetron sputtering. First diamond cutter heads and second diamond cutter heads are brazed to a welding surface of a side wall through laser brazing, wherein a laser power is 1000 W, a scanning speed is 60 mm/min, and a brazing temperature is 950° C. The diamond teeth protection cutter heads are brazed to a welding surface of an external surface of the steel base through vacuum induction brazing, wherein a brazing temperature is 750° C., a pre-pressure is 100 MPa, and a time is 20 s.

Comparative Example 2

A silver tablet (whose composition Ag50Cu34Zn is as same as a silver solder with a grade of L304) with a thickness of 0.2 mm is formed on a surface to be welded of a steel base and diamond head cutter heads (which comprises diamond teeth protection cutter heads) through magnetron sputtering. First diamond cutter heads and second diamond cutter heads are brazed to a welding surface of a side wall through laser brazing, wherein a laser power is 1000 W, a scanning speed is 60 mm/min, and a brazing temperature is 950° C. The diamond teeth protection cutter heads are brazed to a welding surface of an external surface of the steel base through vacuum induction brazing, wherein a brazing temperature is 780° C., a pre-pressure is 100 MPa, and a time is 20 s.

Test results of the brazing shear strength of the embodiments and comparative examples through an electronic universal testing machine are shown in Table 1.

TABLE 1

| | (Shear Strength MPa) | | | | | |
|---|---|---|---|---|---|---|
| | Embodiment 1 | Embodiment 2 | Embodiment 3 | Embodiment 4 | Comparative Example 1 | Comparative Example 2 |
| First diamond cutter heads | 195.2 | 203.8 | 215.9 | 225.7 | 190.2 | 198.5 |
| Second diamond cutter heads | 196.5 | 203.1 | 217.4 | 223.8 | 191.3 | 195.7 |
| Diamond teeth protection cutter heads | 190.1 | 195.3 | 203.6 | 207.9 | 179.2 | 183.2 |

For those skilled in the art, the present invention is merely illustrative of the present invention. It is obvious that the specific embodiments of the present invention are not limited by the above-described means; various non-substantial improvements made by methodologies and technical solutions of the present invention, and the means that the inventive concept and the technical solution of the present invention are directly applied to other applications without modification should be within the protective scope of the present invention.

What is claimed is:

1. A staggered-teeth diamond saw blade, comprising a circular steel base and a side wall provided at an outer edge of the steel base, wherein:
   multiple first diamond cutter heads and multiple second diamond cutter heads are alternately arranged at the side wall; the first diamond cutter heads are staggered towards an outer side of the side wall at a certain distance along an inner side of the side wall; the second diamond cutter heads are staggered towards the inner side of the side wall at a distance along the outer side of the side wall; multiple diamond teeth protection cutter heads are uniformly distributed on an external surface of the steel base; a pre-plating layer is provided at a welding surface where the side wall is welded with the first diamond cutter heads and the second diamond cutter heads; a pre-plating layer is provided at a welding surface where the external surface of the steel base is welded with the diamond teeth protection cutter heads;
   a width of all of the first diamond cutter heads and the second diamond cutter heads is equal to a width of the side wall, and a staggered distance is ¼-½ of the width of the side wall;
   a thickness of the pre-plating layer is in a range of 0.1 mm-0.5 mm;
   the pre-plating layer comprises a copper or copper alloy sub-layer;

the pre-plating layer further comprises a nickel base sub-layer with a thickness in a range of 0.05 mm-0.2 mm.

2. A method for preparing a staggered-teeth diamond saw blade, comprising:

(1) preparing a circular steel base, multiple first diamond cutter heads, multiple second diamond cutter heads and multiple diamond teeth protection cutter heads, and pretreating a welding surface of the circular steel base through purification;

(2) forming a pre-plating layer on the welding surface of the circular steel base through vacuum coating; and (3) processing the multiple first diamond cutter heads and multiple second diamond cutter heads on a side wall where the pre-plating layer is formed through laser brazing, and processing the multiple diamond teeth protection cutter heads on an external surface of the circular steel base where the pre-plating layer is formed through high frequency induction brazing, wherein: the first diamond cutter heads are staggered towards an outer side of the side wall at a certain distance along an inner side of the side wall; the second diamond cutter heads are staggered towards the inner side of the side wall at a certain distance along the outer side of the side wall, wherein:

the pre-plating layer is formed through vacuum coating or arc ion plating;

the pre-plating layer comprises a copper or copper alloy sub-layer;

the pre-plating layer further comprises a nickel base sub-layer with a thickness of 0.05 mm-0.2 mm.

* * * * *